United States Patent

Yun et al.

Patent Number: 5,885,756
Date of Patent: Mar. 23, 1999

[54] METHODS OF PATTERNING A SEMICONDUCTOR WAFER HAVING AN ACTIVE REGION AND A PERIPHERAL REGION, AND PATTERNED WAFERS FORMED THEREBY

[75] Inventors: Cheon-jin Yun; Kyoung-sub Shin, both of Kyungki-do, Rep. of Korea

[73] Assignee: Samsung Electronics Co., Ltd., Suwon, Rep. of Korea

[21] Appl. No.: 659,740

[22] Filed: Jun. 6, 1996

[30]     Foreign Application Priority Data

Sep. 13, 1995 [KR] Rep. of Korea ................ 95-29882

[51] Int. Cl.$^6$ ........................................... G03C 5/00
[52] U.S. Cl. ........................ 430/394; 430/313; 430/328
[58] Field of Search ................................ 430/313, 328, 430/394

[56]            References Cited

U.S. PATENT DOCUMENTS

| | | | |
|---|---|---|---|
| 3,615,466 | 10/1971 | Sahni | 96/36.2 |
| 4,211,834 | 7/1980 | Lapadula et al. | 430/326 |
| 4,498,227 | 2/1985 | Howell et al. | 29/576 B |
| 4,591,547 | 5/1986 | Brownell | 430/312 |
| 4,610,948 | 9/1986 | Glendinning | 430/296 |
| 4,869,998 | 9/1989 | Eccles et al. | 430/311 |
| 5,068,169 | 11/1991 | Takechi et al. | 430/313 |
| 5,126,231 | 6/1992 | Levy | 430/313 |
| 5,356,758 | 10/1994 | Orvek | 430/322 |
| 5,460,922 | 10/1995 | Swirbel et al. | 430/315 |
| 5,468,595 | 11/1995 | Livesay | 430/296 |
| 5,512,397 | 4/1996 | Leedy | 430/30 |
| 5,569,944 | 10/1996 | Delaney et al. | 257/198 |
| 5,587,260 | 12/1996 | Miyazaki et al. | 430/7 |
| 5,648,198 | 7/1997 | Shibata | 430/296 |
| 5,728,507 | 3/1998 | Rhoades et al. | 430/313 |

OTHER PUBLICATIONS

Wolf and Tauber, "*Silicon Processing for the VLSI Era: vol. 1, Process Technology*", copyright 1986, Lattice Press, pp. 471–473.

Primary Examiner—Nam Nguyen
Assistant Examiner—Steven H. Ver Steeg
Attorney, Agent, or Firm—Myers Bigel Sibley & Sajovec

[57]            ABSTRACT

A semiconductor wafer having an active region where the active semiconductor devices are formed and a peripheral region between the active region and the wafer edge, is patterned by forming a patterned photoresist layer on the active region, such that the peripheral region is free of photoresist thereon. The patterned photoresist layer may be formed by forming a photoresist layer on the active region and on the peripheral region of the semiconductor wafer and removing the photoresist layer from the peripheral region of the semiconductor wafer. The photoresist in the active region is patterned. By removing the photoresist layer in the peripheral region of the wafer, excess etchant accumulation at the boundary of the active region and peripheral region is prevented, thereby reducing or preventing pitting of an underlying layer at the boundary.

5 Claims, 2 Drawing Sheets

US 5,885,756

METHODS OF PATTERNING A SEMICONDUCTOR WAFER HAVING AN ACTIVE REGION AND A PERIPHERAL REGION, AND PATTERNED WAFERS FORMED THEREBY

FIELD OF THE INVENTION

This invention relates to microelectronic manufacturing methods and wafers, and more particularly to patterning methods for semiconductor wafers and patterned wafers formed thereby.

BACKGROUND OF THE INVENTION

Lithography is often used in the fabrication of microelectronic devices. As is well known to those having skill in the art, during lithography, a geometrical pattern in a mask or reticle is transferred to a thin layer of photosensitive material, referred to as a photoresist, on the surface of a wafer. The pattern may be used to define various regions on the wafer, such as ion implantation regions, contact holes, metal lines, bonding pads and the like.

In lithography, the patterned photoresist layer is generally not a permanent part of the microelectronic device. Rather, the photoresist pattern is generally transferred to an underlying layer using a selective etch process. The photoresist is then generally removed. The etched layer may or may not become a permanent part of the semiconductor device.

A conventional wafer patterning method will now be described with reference to FIGS. 1–3. FIG. 1 is a plan view of a semiconductor wafer after it has been patterned using conventional lithography. As shown in FIG. 1, because the size of the semiconductor wafer is larger than that of an integrated circuit chip, a plurality of patterns having the same shape or different shapes can be formed on wafer 1. Accordingly, the exposure process is generally carried out by repeatedly exposing a patterned reticle 2 while the wafer 1 moves two-dimensionally in the exposure apparatus, to thereby repeatedly form the same pattern on the wafer. As shown in FIG. 1, four chip patterns are formed in one reticle 2. However, it will be understood by those having skill in the art that larger or smaller numbers of patterns may be formed.

Since the shape of the wafer 1 is generally circular or oval, but the patterns 3 which are formed on the chip are generally rectangular, an active region 5 of the wafer 1 is limited to the central portion of the wafer. The peripheral region 4 of the wafer 1, between the active region 5 and the wafer edge, generally does not contain active semiconductor devices and is generally cut from the wafer during the chip scribing process.

FIG. 2 is a cross-sectional view taken along line A—A of FIG. 1, and which illustrates a patterning process according to a conventional lithography process. An etch stop 11 and a layer 12 are sequentially formed on a semiconductor substrate 10. A patterned photoresist layer 14 is formed on active region 5 and a blanket photoresist region 13 is formed on peripheral region 4. Regions 13 and 14 are generally formed by blanket depositing a photoresist layer on wafer 1 and repeatedly stepping a patterned reticle over the active region. As is well known to those having skill in the art, the reticle may include a predetermined pattern which is formed in a metal film and which is aligned to the wafer. Ultraviolet rays or other radiation is irradiated through the reticle to expose the photoresist layer. The exposure operation is repeatedly performed while the wafer and reticle are stepped in two directions to thereby expose the active region 5. The photoresist is then developed to remove the patterned photoresist, thus forming the structure of FIG. 2. As is well known to those having skill in the art, during the developing process, the photoresist layer 13 in the peripheral region and the unexposed portions of the photoresist layer 14 in the active region of the wafer are not removed, but remain on the wafer.

FIG. 3 illustrates a cross-sectional view of the wafer of FIG. 2 after etching. The photoresist layers 13 and 14 serve as an etch mask so that the pattern of the photoresist layer 14 is transferred to the layer 12 formed thereunder. Unfortunately, when following a conventional photolithography and etching process as described above, a pitting effect may be produced at the etch stop 11 between the active region and the peripheral region. This pitting can damage the etch stop 11, as illustrated in FIG. 3. The damaged etch stop layer may adversely impact the wafer during subsequent fabrication steps.

SUMMARY OF THE INVENTION

It is therefore an object of the present invention to provide improved methods of patterning a semiconductor wafer, and wafers formed thereby.

It is another object of the invention to provide patterning methods for a semiconductor wafer which do not degrade an underlying layer between the active region and the peripheral region during etching.

These and other objects are provided according to the invention, by methods of patterning a semiconductor wafer having an active region where active semiconductor devices are formed, and a peripheral region between the active region and the wafer edge, wherein a patterned photoresist layer is formed on the active region of the semiconductor wafer, such that the peripheral region of the semiconductor wafer is free of photoresist thereon. In particular, a photoresist layer may be formed on the active region and on the peripheral region of the semiconductor wafer. The photoresist layer is removed from the peripheral region of the semiconductor wafer. By removing the photoresist layer from the peripheral region of the semiconductor wafer, it has been found that pitting of an underlying layer between the active region and the peripheral region is reduced and preferably eliminated, thereby improving the reliability of the semiconductor devices which are formed in the wafer.

According to the invention, the step of forming a photoresist layer on the active region and the peripheral region of the semiconductor wafer is followed by the step of patterning the photoresist layer on the active region of the semiconductor. The step of removing the photoresist layer and patterning the photoresist layer are preferably performed simultaneously. The photoresist layer on the peripheral region is blanket exposed and the photoresist layer on the active region is pattern exposed. The photoresist layer is then developed to thereby remove the blanket exposed photoresist layer on the peripheral region and simultaneously pattern the photoresist layer on the active region. It will be understood that the step of blanket exposing the photoresist layer on the peripheral region may occur before or after the step of pattern exposing the photoresist layer on the active region.

After the patterned photoresist layer is formed on the active region, with the peripheral region being free of photoresist, the semiconductor wafer is etched such that a patterned etch is performed in the active region and a blanket etch is formed in the peripheral region. Pitting of the underlying etch stop or other underlying layer at the boundary of the active region and the peripheral region is thereby reduced or prevented, to thereby improve the reliability of the semiconductor devices formed in the wafer. It will be understood by those having skill in the art that the blanket exposure of the peripheral region may be performed by repeatedly stepping an unpatterned reticle over the peripheral region or by exposing the peripheral region with an unpatterned mask. The step of performing a patterned exposure may be performed by a stepping a patterned reticle over the active region or by exposing the active region to a patterned mask.

A microelectronic substrate formed according to the present invention includes a semiconductor wafer having an active region where active devices are formed, and a peripheral region between the active region and the wafer edge. The microelectronic substrate also includes a patterned photoresist layer on the active region of the semiconductor wafer, wherein the peripheral region of the semiconductor wafer is free of photoresist thereon. A microelectronic substrate according to the invention may also include an etch pattern in the active region, underlying the patterned photoresist layer, and corresponding to the patterned photoresist layer. A microelectronic substrate according to the invention also may include a peripheral region which is uniformly etched. High reliability microelectronic substrates are thereby provided.

DETAILED DESCRIPTION OF PREFERRED EMBODIMENTS

Figure 1:
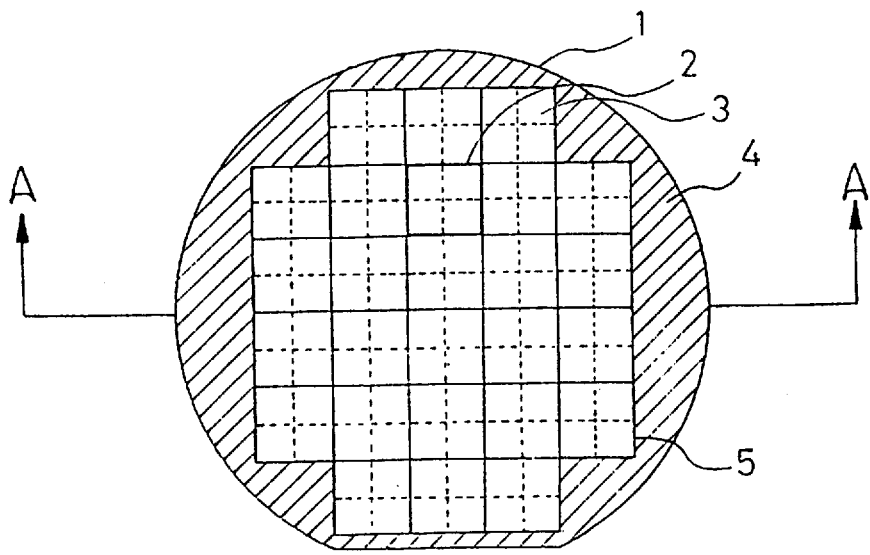
FIG. 1 is a plan view of a wafer after exposure and development according to a conventional patterning process.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 2:
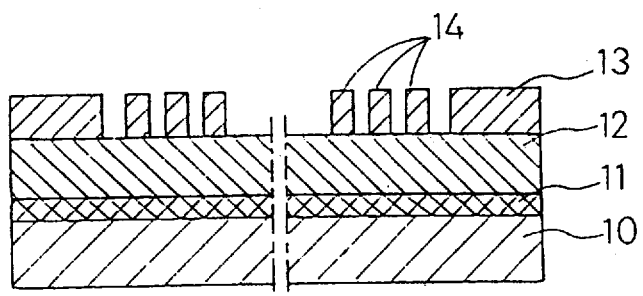
FIG. 2 is a cross-sectional view taken along line A—A of FIG. 1.
Figure 4:
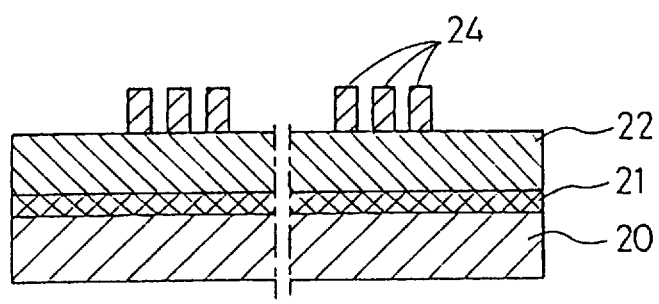
FIG. 4 is a cross-sectional view of a semiconductor wafer in which a pattern is formed according to an embodiment of the present invention.

Referring now to FIG. 4, a cross-sectional view of a semiconductor wafer which is patterned according to an embodiment of the present invention is illustrated. FIG. 4 illustrates a cross-sectional view which corresponds to the cross-sectional view of the prior art wafer in FIG. 2.

As shown in FIG. 4, an etch stop 21 and a layer 22 are sequentially formed on a wafer 20. A photoresist is then blanket coated on the entire surface of wafer 20 including active region 5 and peripheral region 4. In this embodiment, a positive type photoresist is employed. However, a negative type photoresist may also be applied.

Still referring to FIG. 4, a patterned photoresist layer 24 is formed on the active region of the semiconductor wafer, such that the peripheral region of the semiconductor wafer is free of photoresist thereon. The patterned photoresist layer is preferably formed using a two-step exposure process. First, in the peripheral region 4, a pattern is not formed. Rather, a blank reticle having no pattern therein is repeatedly stepped over the peripheral region 4. The blank reticle may have the same size as a reticle which is used to pattern the wafer. For example, a reticle on which four chips are patterned may be used. However, larger or greater number of chips may be included in the reticle. The first exposure process is carried out in a step and retreat process using a reduction lens if necessary, so that the entire peripheral region is blanket exposed.

A second exposure process is carried out using a patterned reticle which is stepped over the active region 5. Multiple patterned reticles may be used. It will be understood that the active region may be exposed prior to the peripheral region and that the two regions may also be exposed simultaneously. Moreover, masks rather than reticles may be used.

The wafer is then dipped in a developer to remove the exposed photoresist and allow the unexposed photoresist pattern 24 to remain. As shown in FIG. 4, the photoresist in the peripheral region 4 is removed and the photoresist pattern 24 in the active region remains. This step completes the pattern formation process.

Figure 5:
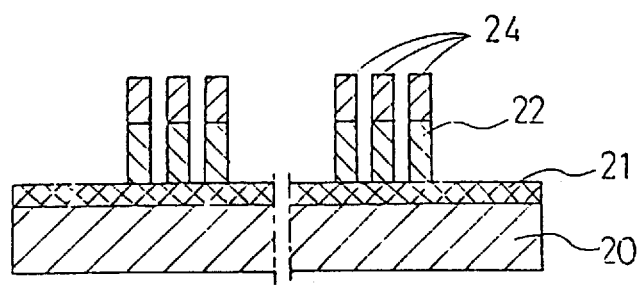
FIG. 5 is a cross-sectional view of the semiconductor wafer of FIG. 4 after etching, according to the present invention.

FIG. 5 is a cross-sectional view of the structure of FIG. 4 after etching. According to the invention, because etching is carried out after the photoresist in the peripheral region of the wafer is removed, the layer 22 is also removed in the peripheral region. This prevents pitting on the etch stop 22 or other underlying layer between the active region and the peripheral region.

Figure 3:
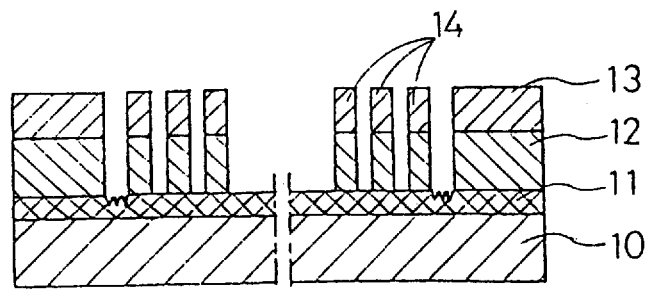
FIG. 3 is a cross-sectional view showing the structure of FIG. 2 after etching.

In particular, it has been found that when photoresist layer 13 remains on the peripheral region of the wafer as shown in FIG. 3, the etch rate at the border of the peripheral region 4 and the active region 5 becomes high, thereby producing the pitting effect in etch stop 11 as shown in FIG. 3. In contrast, the present invention prevents the pitting of etch stop 21 of FIG. 5, which is caused by excess etchant being present at the border of the peripheral region and active region of the wafer. When pitting is prevented, the reliability and the yield of the microelectronic devices are improved.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of patterning a semiconductor wafer having a wafer edge, an active region in a central portion of the semiconductor wafer including an array of integrated circuit chips therein, and a peripheral region between the active region and the wafer edge, the patterning method comprising the steps of:

forming a photoresist layer on the semiconductor wafer, including on the array of integrated circuit chips in the active region and on the peripheral region between the active region and the wafer edge;

exposing the photoresist layer to a blanket exposure in the peripheral region between the active region and the wafer edge in a first exposing step;

exposing the photoresist layer to a patterned exposure in the active region including the array of integrated circuit chips therein in a second exposing step; and developing the exposed photoresist layer to thereby remove the photoresist from the peripheral region between the active region and the wafer edge and to pattern the photoresist layer in the active region including the array of integrated circuit chips therein.

2. A method according to claim 1 wherein the first exposing step comprises the step of stepping an unpatterned reticle over the peripheral region.

3. A method according to claim 1 wherein the second exposing step comprises the step of stepping a patterned reticle over the active region.

4. A method according to claim 1 wherein the second exposing step comprises the step of exposing the active region to a patterned mask.

5. A method according to claim 1 wherein the second exposing step precedes the first exposing step.

* * * * *